(12) United States Patent
Finley

(10) Patent No.: US 6,794,951 B2
(45) Date of Patent: Sep. 21, 2004

(54) SOLID STATE RF POWER SWITCHING NETWORK

(75) Inventor: Kenneth Wilbert Finley, Mead, CO (US)

(73) Assignee: Veeco Instruments, Inc., Woodbury, NY (US)

( * ) Notice: Subject to any disclaimer, the term of this patent is extended or adjusted under 35 U.S.C. 154(b) by 0 days.

(21) Appl. No.: 10/212,967

(22) Filed: Aug. 5, 2002

(65) Prior Publication Data
US 2004/0021525 A1 Feb. 5, 2004

(51) Int. Cl.[7] .................................................. H03H 7/38
(52) U.S. Cl. ..................... 333/32; 333/17.3; 333/33; 333/262
(58) Field of Search .......................... 333/17.3, 32–33, 333/262

(56) References Cited

U.S. PATENT DOCUMENTS

| | | | | |
|---|---|---|---|---|
| 4,485,360 A | * | 11/1984 | Seward | 333/17.3 |
| 4,679,007 A | * | 7/1987 | Reese et al. | 333/17.3 |
| 4,712,020 A | * | 12/1987 | Basile | 307/117 |
| 5,195,045 A | * | 3/1993 | Keane et al. | 333/17.3 |
| 5,422,608 A | * | 6/1995 | Levesque | 333/17.3 |
| 5,654,679 A | * | 8/1997 | Mavretic et al. | 333/17.3 |
| 5,936,481 A | * | 8/1999 | Fujii | 333/17.3 |
| 6,259,334 B1 | * | 7/2001 | Howald | 333/17.3 |
| 6,271,727 B1 | | 8/2001 | Schmukler | 330/284 |
| 6,307,445 B1 | * | 10/2001 | Makinen et al. | 333/32 |
| 6,313,584 B1 | * | 11/2001 | Johnson et al. | 315/111.21 |
| 6,373,347 B1 | | 4/2002 | Cogan | 333/81 R |
| 6,408,069 B1 | * | 6/2002 | Furlong | 379/394 |
| 6,424,232 B1 | * | 7/2002 | Mavretic et al. | 333/17.3 |
| 6,677,828 B1 | * | 1/2004 | Harnett et al. | 333/17.3 |
| 2003/0080824 A1 | * | 5/2003 | Tanaka et al. | 333/33 |
| 2003/0096583 A1 | * | 5/2003 | Watanabe | 455/90 |
| 2003/0186667 A1 | * | 10/2003 | Wallace | 455/284 |
| 2003/0215373 A1 | * | 11/2003 | Reyzelman et al. | 422/186.29 |

OTHER PUBLICATIONS

Cavery, Hiller, "Establishing the Minimum Reverse Bias for a p–1–n Diode in a High Power Switch, "IEEE Transactions on Microwave Theory and Techniques, vol. 38, No. 12, Dec. 1990.

* cited by examiner

Primary Examiner—Michael Tokar
Assistant Examiner—Khai Nguyen
(74) Attorney, Agent, or Firm—Hensley Kim & Edgington, LLC

(57) ABSTRACT

An RF matching network includes a switching element that quickly switching between a first matching sub-network and a second matching sub-network, such that the impedance of neither sub-network is coupled to the other when selected by the switch. In one embodiment, the switching element includes a bipolar transistor, a TRIAC device and a PIN diode. The PIN diode conducts or attenuates the RF signal depending on its bias voltage. The bipolar transistor controls the bias voltage on the PIN diode. The TRIAC device protects the bipolar transistor damage that can be caused from high voltages generated at the PIN diode when the PIN diode is not conducting the RF signal.

30 Claims, 5 Drawing Sheets

SOLID STATE RF POWER SWITCHING NETWORK

FIELD OF THE INVENTION

This invention generally relates to RF (Radio Frequency) switching capability, and, in particular, to controlling impedance matching in an RF matching network using solid state elements.

BACKGROUND OF THE INVENTION

Some plasma ion sources are driven by an RF power source that ionizes a gas to create a plasma. However, the plasma presents a complex impedance to the power source. Therefore, RF matching networks are commonly designed to match the complex impedance of the plasma so as to present a resistive load to the power source. For example, in a typical plasma ion source, an RF matching network can convert a complex impedance of a plasma at 13.56 MHz to a 50-Ohm resistive load for the generator. It should also be understood that such RF matching networks are employed to match other loads that present a complex impedance, such as transmission lines, filter networks, signal-processing circuits, and free-space antenna systems.

In certain plasma applications, an RF matching network runs in at least two modes: (1) a START mode, when no plasma initially exists in the plasma chamber; and (2) a RUN mode, after the plasma has been ignited. The two modes present dramatically different loads to the RF power generator. Therefore, the load capacitance of the matching network must change dramatically and quickly when the plasma is ignited.

In one approach, the load capacitance of the matching network is modified by a mechanical drive that changes the spacing of the capacitive gap of large load capacitor. This approach results in large, slow, complex, and failure-prone matching network implementations.

Another approach is to configure a matching network portion for START mode and then use mechanical relays to couple additional load capacitance to supplement the START load capacitance when the network switches to RUN mode. However, this approach couples the impedance of the two different impedances, making is difficult to tune each impedance to optimize impedance matching in both modes. In addition, such an approach also results in matching networks that are too large and inefficient, require too many expensive components, and switch too slowly for some plasma applications.

SUMMARY OF THE INVENTION

Against this backdrop, the present invention has been developed. The present invention relates to an improved RF switching network employing solid-state transistors, PIN diodes, and TRIAC interfaces, or some sub-combination thereof. In one embodiment, PNP bipolar transistors and PIN diode attenuators are used to switch quickly between a matching network tuned to the START mode impedance and a matching network tuned to the RUN mode impedance. In another embodiment, a TRIAC interface is introduced between the PNP transistor and the PIN diode to isolate the PNP transistor's collector from the high voltage generated at the input to the PIN diode under reverse-bias conditions. The isolation protects the PNP transistor collector-base junction from failure cause by a $V_{CBO}$ that exceeds the transistor's collector-base breakdown voltage.

These and various other features as well as other advantages, which characterize the present invention, will be apparent from a reading of the following detailed description and a review of the associated drawings.

DETAILED DESCRIPTION

Figure 1:
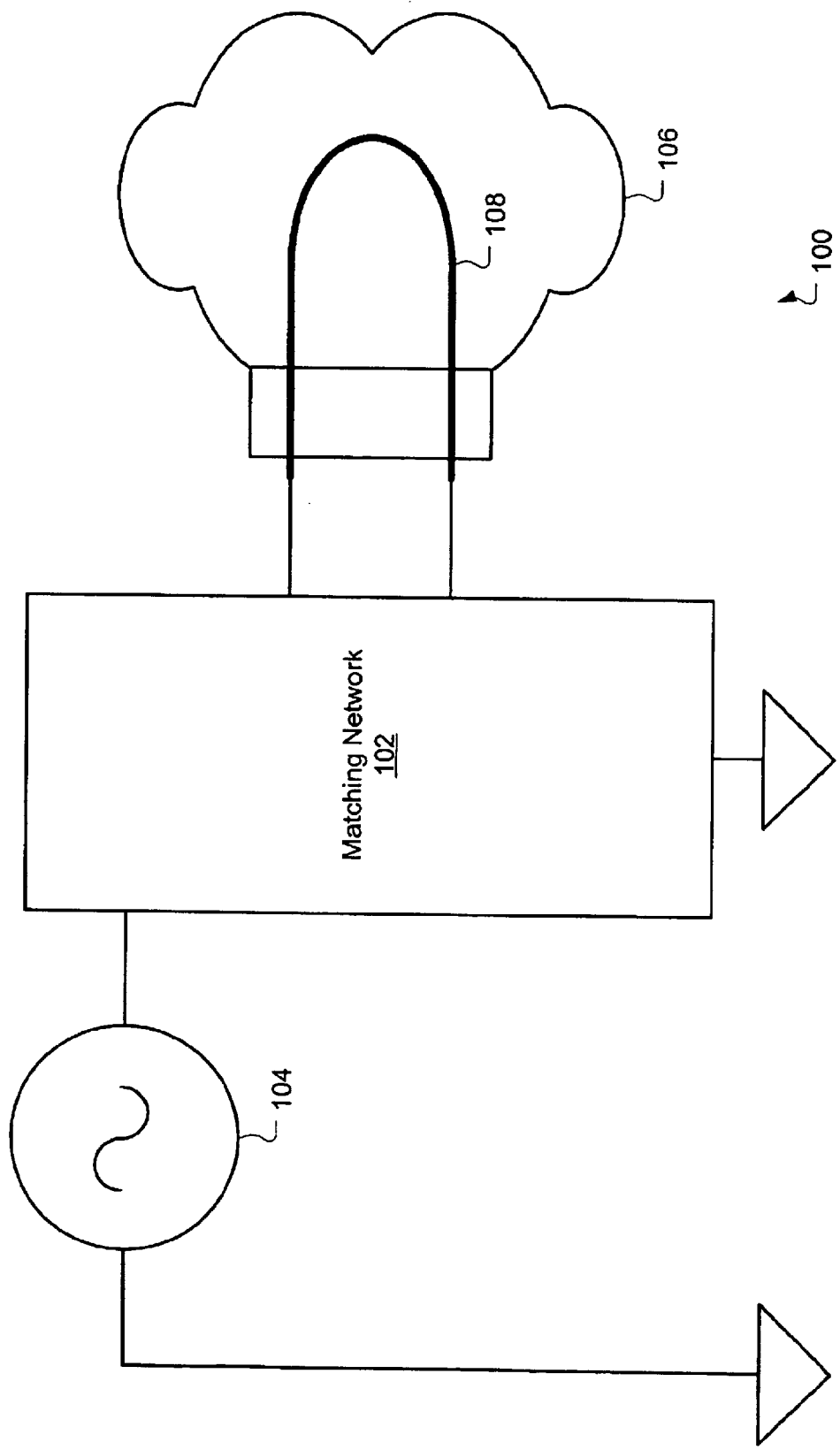
FIG. 1 schematically depicts an RF generator, an RF matching network, and a plasma source in an embodiment of the present invention.

FIG. 1 schematically depicts an RF generator, an RF matching network, and a plasma source in an embodiment of the present invention. A plasma ion source 100 is powered by an RF power generator 104, such as a 13.56 MHz power generator supplying an RF power signal with a peak magnitude of 500 volts. The RF power signal is applied through an RF matching network 102 to an antenna 108. The RF signal in the antenna ionizes a gas in a plasma chamber (not shown) to generate a plasma 106.

The RF matching network 102 is designed to match the complex impedance presented by the plasma. Furthermore, the two modes of operation: (1) START mode, when the plasma is not yet present in the chamber; and (2) RUN mode, when the plasma has ignited, present dramatically different impedances requiring dramatically different capacitive loads in the matching network 102. As such, the matching network 102 includes two matching sub-networks (one for each mode), which the matching network 102 must switch between rapidly in order to maintain the plasma. That is, failure to switch between the different matching networks quickly enough can cause the plasma that is ignited in START mode to extinguish before the switch to RUN mode (i.e., and therefore the RUN impedance) can be fully accomplished.

It should be understood that the utility of the embodiments of the present invention is not limited to ignition of plasma. For example, an RF neutralizer matching network can be used to generate electron emissions to neutralize the charge near a target of an ion beam. Other applications requiring high voltage RF power sources may also benefit from embodiments of the present invention.

Figure 2:
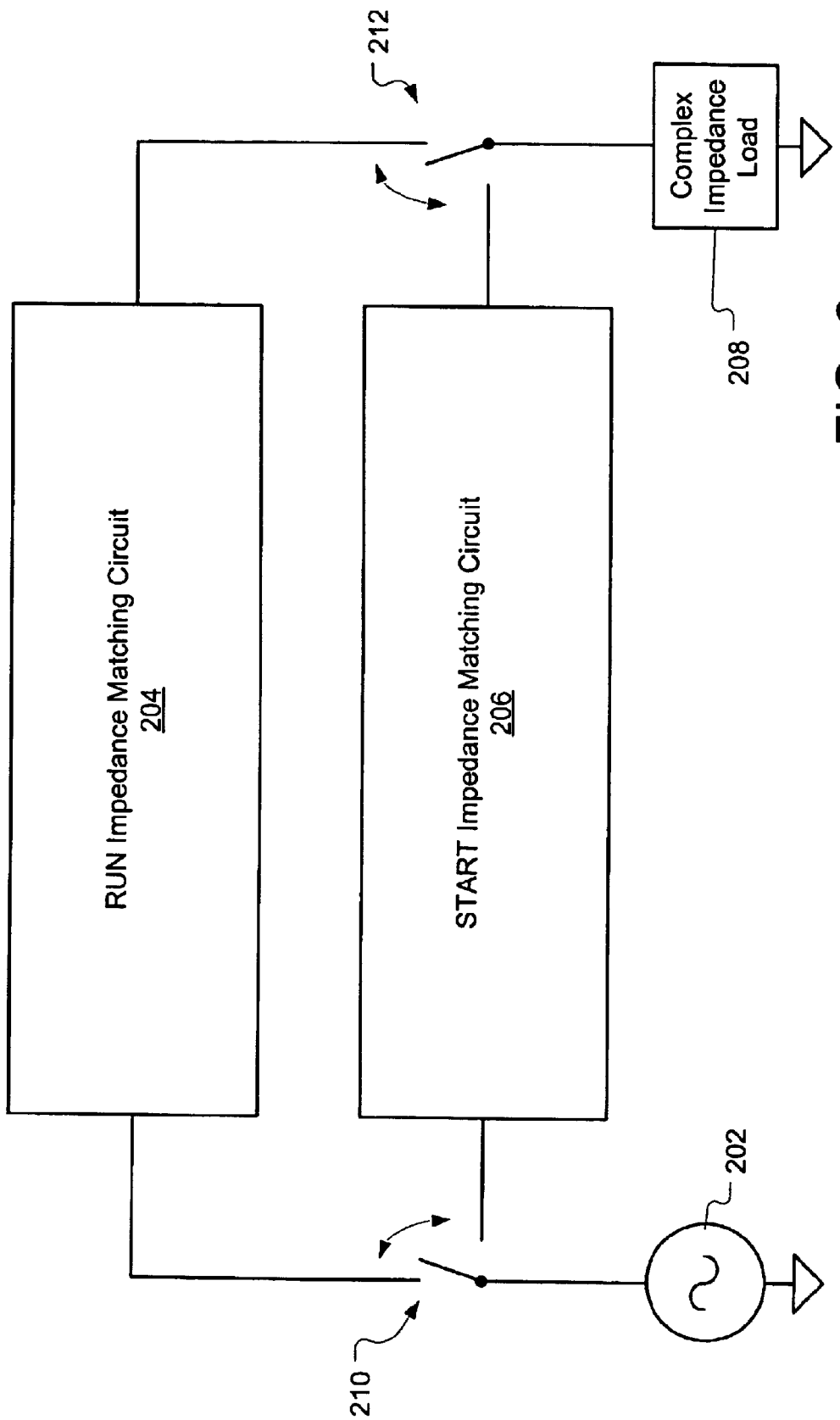
FIG. 2 schematically depicts a dual mode RF matching network in an embodiment of the present invention.

FIG. 2 schematically depicts a dual mode RF matching network in an embodiment of the present invention. The solid state switching elements of an embodiment of the present invention provide switching between the two matching impedances of START and RUN mode that is fast enough to maintain the plasma, wherein the two matching impedances are not coupled in one of the modes. This approach greatly simplifies the load tuning required in each mode.

As shown in FIG. 2, an RF power generator 202 may be coupled to either the START Impedance Matching Sub-network 206 or the RUN Impedance Matching Sub-network 204 to drive a complex impedance load 206. The switches 210 and 212 operating in unison to isolate one or the other sub-network from the RF power generator 202 and the complex impedance load 206. Although exemplary embodiments are illustrated and described with respect to a plasma ion source, embodiments of the present invention may be implemented in other systems, such as wireless communications, inductive heating, and various other plasma-related applications.

Figure 3:
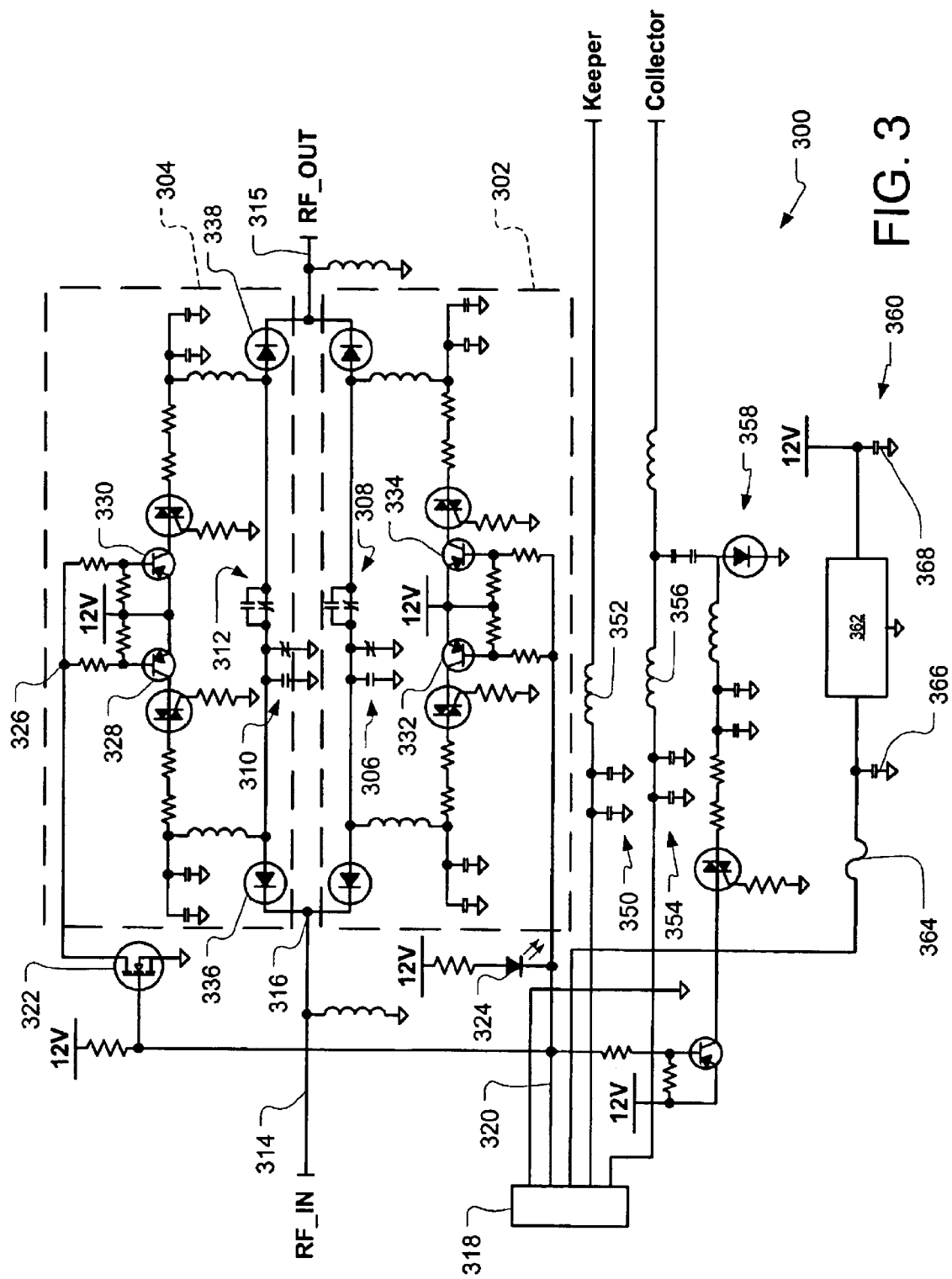
FIG. 3 illustrates an exemplary RF matching network circuit in an embodiment of the present invention.

FIG. 3 illustrates an exemplary RF matching network circuit in an embodiment of the present invention. The schematic sub-networks of FIG. 2 may be mapped into the RF matching network 300 of FIG. 3. Particularly, in one embodiment of the present invention, the START Impedance Matching Sub-network 206 corresponds to the dashed line box 302 and the RUN Impedance Matching Sub-network 204 corresponds to the dashed line box 304. It should also be understood that switching between more than two modes is contemplated within the scope of the present invention.

Various elements of the RF matching network are now described. Note that the impedance of the START and RUN mode sub-networks 302 and 304 are described as dramatically different, which is accomplished by different circuit element values (or "tuned" element values) within each sub-network. For example, the variable load capacitors 306 in the START sub-network 302 may be roughly set to match the impedance of the complex impedance load (e.g., antenna in the plasma chamber) before and during ignition of the plasma. Furthermore, the variable tune capacitors 308 may be finely tuned to more precisely match the complex impedance load in the START mode. An exemplary complex impedance load in START mode is 5Ω+j101Ω.

In contrast, the variable load capacitors 310 in the RUN sub-network 304 may be roughly set to match the impedance of the complex impedance load after ignition of the plasma. Furthermore, the variable tune capacitors 312 may be finely tuned to more precisely match the complex impedance load in the RUN mode. An exemplary complex impedance load in RUN mode is 9Ω+j105Ω. By rapidly switching from the START sub-network to the RUN sub-network at plasma ignition, a sufficient power signal can be maintained to the antenna so that the plasma can be maintained in the chamber. It is further observed that the various loads are not coupled in one mode or the other, thereby simplifying the tuning of the matching network in both modes. The operation of the matching network is described below with regard to sub-network 304, although the description applies equally to sub-network 302.

The RF signal is received from the RF generator via line 314, which is marked "RF_IN" and directed to junction 316 between the two sub-networks. The RF signal is typically a high frequency (e.g., 13.56 MHz), high voltage (e.g., with a peak voltage magnitude of 500 volts), although other signal configurations are contemplated within the scope of the present invention. The RF signal is output to the complex impedance load via line 315, which is marked "RF_OUT".

A control signal is received through coupler 318 on line 320 and is received by transistor 322, which inverts the control signal to sub-network 304. Therefore, the control signal effectively toggles between activating sub-network 302 and sub-network 304. When the control signal is low, current flows through light-emitting diode 324 to provide an indication to an operator that the system is in START mode.

When the control signal is high, the voltage at junction 326 is low by virtue of the inversion through transistor 322. As such, transistors 328 and 330 are turned on (while transistors 332 and 334 are turned off), which applies a roughly 12 volt bias to the inputs of PIN diodes 336 and 338. Accordingly, the bias applied to the PIN diodes 336 and 338 allows the RF_IN signal to flow through the RUN matching load sub-network, including capacitors 310 and 312, to conduct the RR_OUT signal to the complex impedance load.

In contrast, when the control signal is low, the voltage at junction 326 is high by virtue of the inversion through transistor 322. As such, transistors 328 and 330 are turned off (while transistors 332 and 334 are turned on), which applies a roughly zero volt bias to the inputs of PIN diodes 336 and 338. Accordingly, the bias applied to the PIN diodes 336 and 338 prevents the RF_IN signal to flow through the RUN matching load network, including capacitors 310 and 312, and isolates the RUN matching load sub-network from the complex impedance load and the START matching load sub-network.

In one embodiment, the RF matching network may include a keeper circuit for providing power to a keeper grid. In a two grid charged particle (e.g., electrons or ions) source, for example, a keeper grid maintains the charge in the source chamber. Two fixed capacitors 350 and an inductor 352 in the keeper circuit function as a second-order low-pass filter network to isolate the RF wave from the DC power supply feeding the keeper.

Typically, the second grid in a two-grid charged particle source is called a collector. The collector grid functions to extract charged particles from the charged particle source. The collector circuit includes a low-pass filter network having two capacitors 354 and an inductor 356. The keeper circuit also includes a switchable matching network 358 for igniting a gas into a plasma by creating a very high RF voltage potential. The switchable matching network 358 includes a PIN diode switching circuit.

Circuit 360 converts a poorly regulated 24 volt DC source to a regulated 12 volt DC source for use by the solid state matching RF power switching electronics. A three terminal voltage regulator outputs a 12 volt DC output. A fuse 364 protects the circuit in case of malfunction. Capacitors 366 and 368 are filtering capacitors that minimize noise and ripple signal on the DC supply lines.

Figure 4:
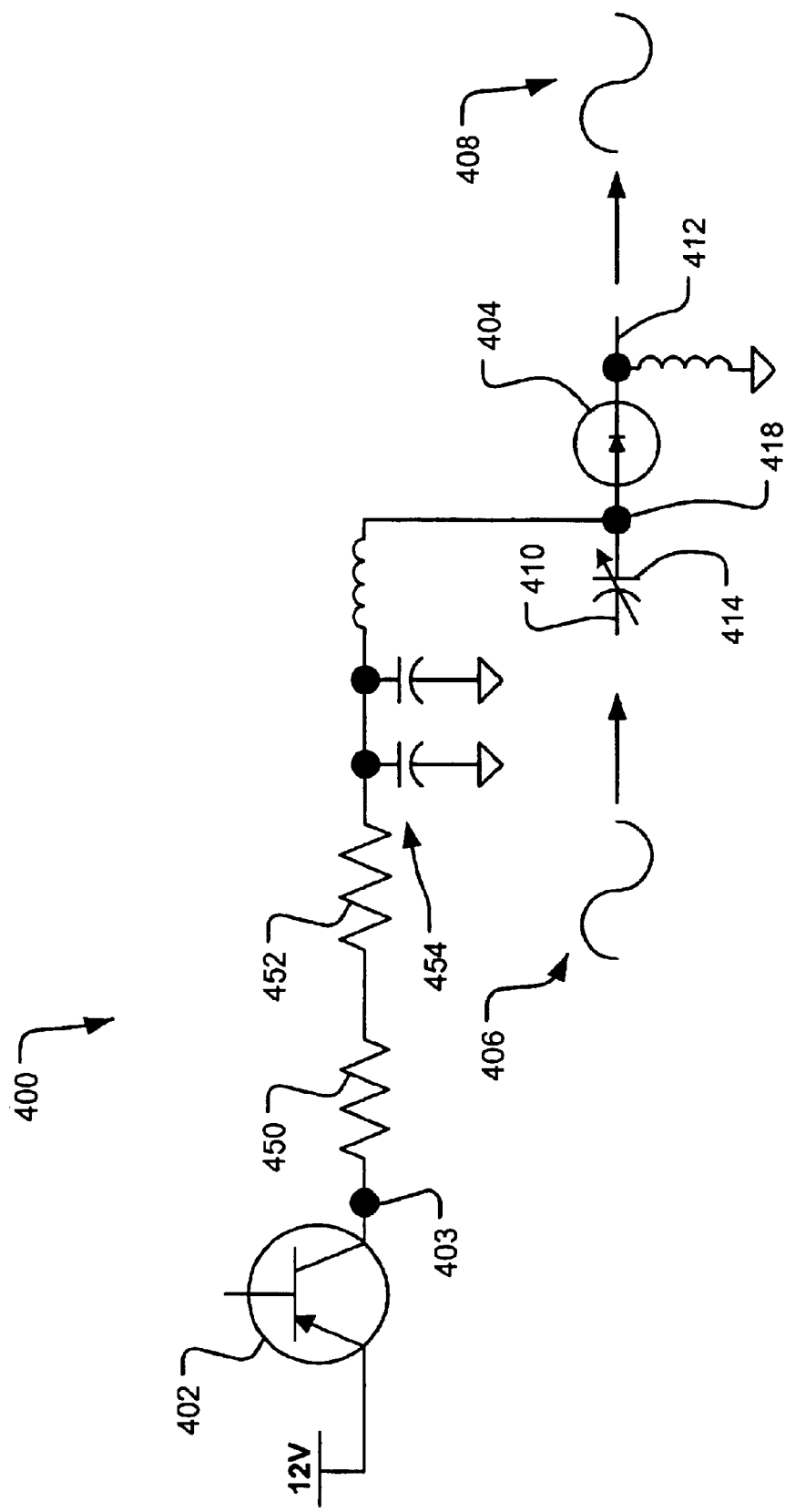
FIG. 4 illustrates a PIN diode controlled switch in an RF matching network of an embodiment of the present invention.

FIG. 4 illustrates a PIN diode controlled switch in an RF matching network of an embodiment of the present invention. A switching element 400 includes a transistor 402 and a PIN diode 404. Two resistors are used to limit DC current flow through the PIN diode 404. Two fixed capacitors 454 and an inductor 456 function as a second-order low-pass filter network to isolate the RF wave from the PIN diode DC control logic circuitry. The variable tune capacitor 458 matches the complex load to the RF generator and provides DC isolation to the anode side of the PIN diode.

An RF signal 406 can be received at line 410, communicated through a tune capacitor 414 and received by the PIN diode 404. The PIN diode 404 normally acts as a rectifier under zero-bias DC conditions. In the presence of an applied RF signal, an ideal rectifier diode will instantaneously conduct when the RF voltage places the diode into its forward bias state. However, the PIN diode 404 does not show the same instantaneous turn-on time as the ideal rectifier diode. Rather, the RF signal must be positive for a finite amount of time before the diode starts conducting in the forward direction. This "turn-on time" is the time required for the intrinsic region of the PIN diode 404 to fill with charged carriers during the forward cycle of the applied RF signal. Therefore, if the frequency of the RF signal is high enough compared to the turn-on time, the PIN diode 404 never starts conducting in zero-bias conditions. Therefore, the RF signal is attenuated at (i.e., not communicated through) the PIN diode. In this operation, the PIN diode 404 is said to develop a self-generated DC bias voltage.

Furthermore, increasing the intrinsic region thickness effectively increases the transit time of the RF signal. In order for the PIN diode to develop a self-generated DC bias voltage, and remain in an off-state condition, the transient time frequency of the intrinsic region must be longer than the period of the RF signal.

However, a forward-bias can be applied to the PIN diode 404 by switching on the transistor 402. When the transistor 402 is turned on (e.g., with a low signal on the base of the PNP transistor 402), a DC (direct current) bias voltage is applied to junction 418, and therefore the PIN diode 404, putting it in a forward bias mode. If an adequate forward bias is applied to the diode 404, the intrinsic region of the diode 404 fills with charged carriers and conducts the entire RF signal (i.e., peak to peak) to the line 412 resulting in RF_OUT signal 408.

In summary, by turning on the transistor 402, a forward bias is applied to the PIN diode, which passes the RF signal to the RF output on line 412. By turning off the transistor 402, a zero-bias is applied to the PIN diode and, assuming the transient time frequency of the intrinsic region must be longer than the period of the RF signal, the RF signal is completely attenuated at the PIN diode.

Figure 5:
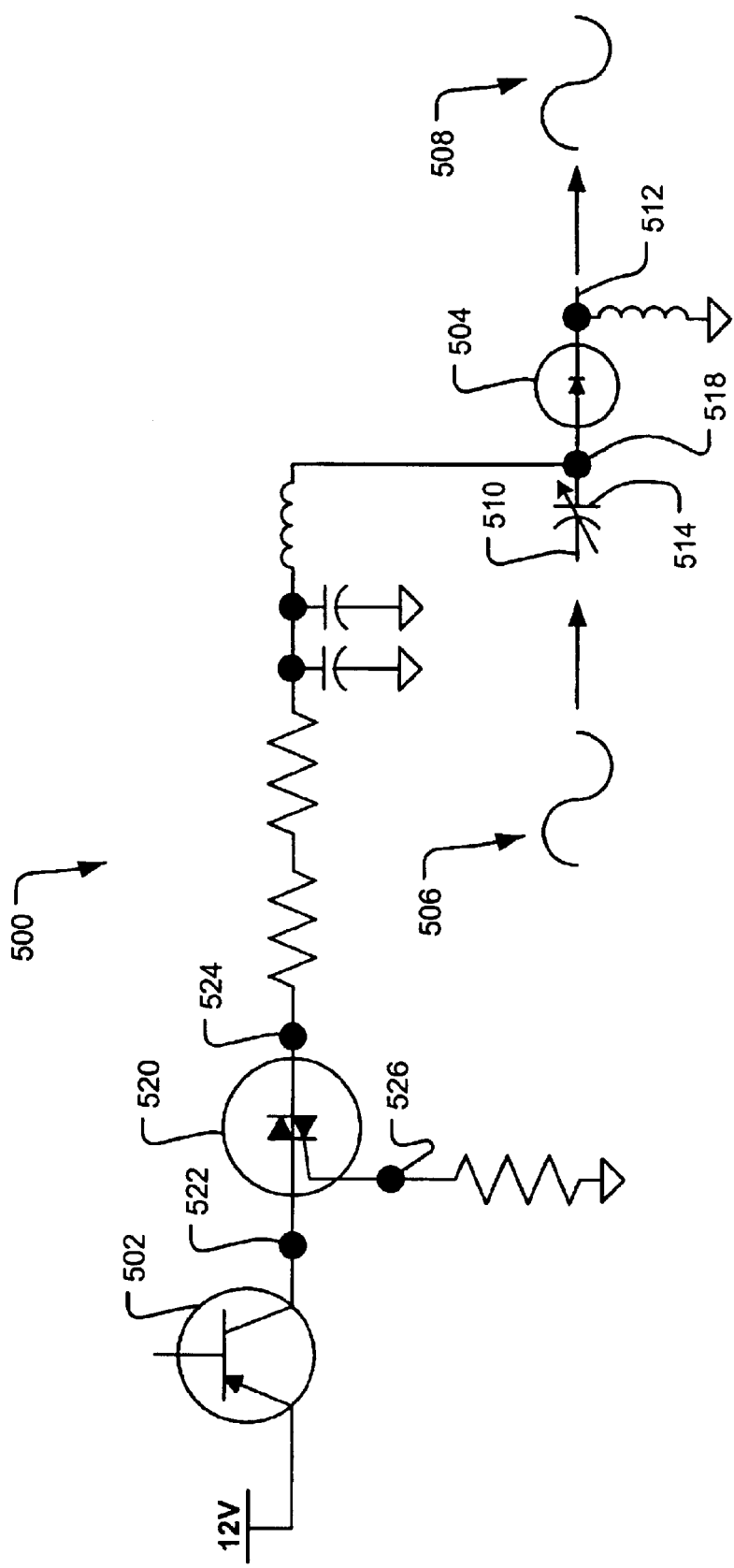
FIG. 5 illustrates a PIN diode controlled switch in an RF matching network of an alternative embodiment of the present invention.

FIG. 5 illustrates a PIN diode controlled switch in an RF matching network of an alternative embodiment of the present invention. A limitation, although not fatal to operation, of the switch illustrated in FIG. 4 is that in many high-voltage applications, the voltage built up at junction 403 can exceed the breakdown voltage limitation of the transistor 402. For example, an RF signal having a peak magnitude of 500 volts can result in a −500 volt DC (direct current) potential at the collector terminal of the transistor 402, exceeding the breakdown voltage of the transistor 402, and, therefore, in device failure.

In FIG. 5, a switching element 500 includes a transistor 502, a TRIAC device 520, and a PIN diode 504. Generally, a TRIAC device is a three-terminal AC (alternating current) semiconductor switch that is triggered into conduction when a low-energy signal is applied to its gate. The TRIAC device is a bilateral device with the terminals designated as MT1 (terminal 522), MT2 (terminal 524) and G (terminal 526), where MT1 and MT2 are the current-carrying terminals, and G, is the gate terminal used for triggering the TRIAC device. Standard practice is to specify all currents and voltages using MT1 as a reference point. The TRIAC device is a five-layer device with the region between MT1 and MT2 being P-N-P-N switch (SCR) in parallel with a N-P-N-P switch (complementary SCR). The region between MT1 and G consists of two complementary diodes. A positive or negative gate signal will forward-bias one of these diodes causing the same transistor action found in the SCR. This action breaks down the blocking junction regardless of the polarity of MT1. Current flow between MT1 and MT2 then causes the device to provide gate current internally. It will remain on until this current flow is interrupted.

Whenever the TRIAC device is turned OFF, no current can flow between MT1 and MT2 no matter what the polarity of the externally applied voltage. In this case, the TRIAC device acts like an open switch. When the TRIAC device is turned ON, there is a very low-resistance current flow path from MT1 to MT2. In this case, the TRIAC acts like a closed switch. The TRIAC device discussed above describes TRIAC devices generally although other configurations of TRIAC devices may exist with in the scope of the present invention.

An RF signal 506 can be received at line 510, communicated through a tune capacitor 514 and received by the PIN diode 504. A forward-bias can be applied to the PIN diode 504 by switching on the transistor 502. When the transistor 502 is turned on (e.g., with a low signal on the base of the PNP transistor 502), a DC (direct current) bias voltage is applied to junction 518, and therefore the PIN diode 504, putting it in a forward bias mode. If an adequate forward bias is applied to the diode 504, the intrinsic region of the diode 504 fills with charged carriers and conducts the entire RF signal (i.e., peak to peak) to the line 512, resulting in RF_OUT signal 508.

When the transistor 502 is turned on (e.g., with a low signal on the base of the PNP transistor 502), current conducts from MT1 to MT2 and to the PIN diode 504. Therefore, a DC (direct current) bias voltage is applied to junction 518, and therefore the PIN diode 504, putting it in a forward bias mode. If an adequate forward bias is applied to the diode 504, the intrinsic region of the diode 504 fills with charged carriers and conducts the entire RF signal (i.e., peak to peak) to the line 512, resulting in RR_OUT signal 508. If the transistor 502 is turned off, the TRIAC device 520 turns off and current flow between MT1 and MT2 terminates, but the resulting voltage that builds up at junction 524 is isolated from collector terminal 522 of the transistor 502 by the turned-off TRIAC device 520.

In summary, by turning on the transistor 502, a forward bias is applied to the PIN diode, which passes the RF signal to the RF output on line 512. By turning off the transistor 502, a zero-bias is applied to the PIN diode and, assuming the transient time frequency of the intrinsic region must be longer than the period of the RF signal, the RF signal is completely attenuated at the PIN diode. Meanwhile, when the transistor 502 is off, the TRIAC device 520 protects the transistor 502 from the high voltage that builds up at junction 524, thereby avoiding transistor failures.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A radio frequency matching network having a radio frequency power signal input and a radio frequency power signal output, the radio frequency matching network comprising:

a first matching sub-network having a first load impedance matching impedance in a first mode of powering a plasma load;

a second matching sub-network having a second load impedance matching impedance in a second mode of powering a plasma load; and at least one switching element positioned to switch between the first matching sub-network and the second matching sub-network, in the first mode, the at least one switching element coupling the radio frequency power signal input and the radio frequency power signal output through the first matching sub-network and isolating the radio frequency power signal input and the radio frequency power signal output from the second matching sub-network, and in the second mode, the at least one switching element coupling the radio frequency power signal input and the radio frequency signal power output through the second matching sub-network and isolating the radio frequency power signal input and the radio frequency power signal output from the first matching sub-network.

2. The radio frequency matching network of claim 1 wherein the at least one switching element comprises:
   a diode coupled to receive an input radio frequency power signal and to output an output radio frequency power signal;
   a bipolar transistor having a collector terminal electrically coupled to the diode, the bipolar transistor providing a forward bias voltage to the diode in the first mode and a non-forward bias voltage in the second mode, wherein the diode conducts the input radio frequency power signal to its output to provide the output radio frequency power signal in the first mode and does not conduct the input radio frequency power signal to its output to provide the output radio frequency power signal in the second mode.

3. The radio frequency matching network of claim 2 wherein the at least one switching element further comprises:
   a TRIAC device coupled between the bipolar transistor and the diode conducting the forward bias voltage from the bipolar transistor when the bipolar transistor is on.

4. The radio frequency matching network of claim 1 wherein the at least one switching element further comprises:
   a TRIAC device coupled between the bipolar transistor and the diode isolating the bipolar transistor from the diode when the bipolar transistor is off and the diode is non-conducting.

5. The radio frequency matching network of claim 1 wherein the at least one switching element further comprises:
   a first switching element coupled in the first matching network between a control signal input and the radio frequency power signal input; and
   a second switching element coupled in the first matching network between a control input signal and the radio frequency power signal output.

6. The radio frequency matching network of claim 5 wherein the at least one switching element further comprises:
   a third switching element coupled in the second matching network between a control signal input and the radio frequency power signal input; and
   a fourth switching element coupled in the second matching network between a control input signal and the radio frequency power signal output.

7. The radio frequency matching network of claim 1 wherein the first mode and second mode operate separately in time.

8. The radio frequency matching network of claim 1 wherein the first made is a START mode and the second mode is a RUN mode.

9. The radio frequency matching network of claim 1 wherein the RF power signal operates on a single load.

10. The radio frequency matching network of claim 9 wherein the single load includes an antenna in a plasma chamber.

11. The radio frequency matching network of claim 1 wherein the at least one switching element couples the radio frequency power signal input and the radio frequency power signal output through the second matching sub-network in the second mode fast enough to maintain a plasma.

12. The radio frequency matching network of claim 1 further comprising a keeper circuit providing power to a keeper grid, the keeper grid maintaining a charge in a plasma chamber.

13. The radio frequency matching network of claim 12 wherein the keeper circuit further comprises two fixed capacitors and an inductor to isolate the radio frequency power signal input from a DC power supply feeding the keeper circuit.

14. A switching element for conducting an input radio frequency signal to provide an output radio frequency signal, the switching element comprising:
   a diode coupled to receive an input radio frequency signal and to output an output radio frequency signal;
   a bipolar transistor having a collector terminal electrically coupled to the diode, the bipolar transistor providing a forward bias voltage to the diode in a first mode and a non-forward bias voltage in a second mode, wherein the diode conducts the input radio frequency to its output to provide the output radio frequency signal in the first mode and does not conduct the input radio frequency to its output to provide the output radio frequency signal in the second mode; and
   a TRIAC device coupled to the bipolar transistor to isolate the radio frequency signal from the bipolar transistor.

15. The switching element of claim 14 wherein said TRIAC device is coupled between the bipolar transistor and the diode conducting the forward bias voltage from the bipolar transistor when the bipolar transistor is on.

16. The switching element of claim 14 wherein said TRIAC device is coupled between the bipolar transistor and the diode isolating the bipolar transistor from the diode when the bipolar transistor is off and the diode is non-conducting.

17. A method of switching a radio frequency signal, the radio frequency signal being input to a radio frequency input, the method comprising:
   coupling a PIN diode between the radio frequency input and a radio frequency output;
   coupling a transistor to an input to the PIN diode, the transistor receiving a control signal;
   isolating the radio frequency input from the transistor with a TRIAC device;
   attenuating the radio frequency signal at the PIN diode when the control signal turns off the transistor; and
   conducting the radio frequency signal through the PIN diode to the radio frequency output when the control signal turns on the transistor.

18. The method of claim 17 further comprising:
   coupling the TRIAC device between the transistor and the PIN diode.

19. The method of claim 17 further comprising:
   coupling a radio frequency matching impedance between the radio frequency signal input and the PIN diode.

20. A method of switching a radio frequency power signal between a first matching sub-network having a first load impedance matching impedance in a first mode of powering a plasma load and a second matching sub-network having a second load impedance matching impedance in a second mode of powering a plasma load, the radio frequency power signal being input to a radio frequency input, the method comprising:

operating in a first mode by:
  coupling the radio frequency power signal input and the radio frequency signal output through the first matching sub-network;
  isolating the radio frequency power signal input and the radio frequency power signal output from the second matching sub-network; and operating in a second mode by:
  coupling the radio frequency power signal input and the radio frequency power signal output through the second matching sub-network;
  isolating the radio frequency power signal input and the radio frequency power signal output from the first matching sub-network.

21. The method of claim 20 wherein the radio frequency power signal input and the radio frequency power signal output is coupled through the first matching sub-network is via a first PIN diode and through the second matching sub-network via a second PIN diode.

22. The method of claim 20 further comprising:
  providing a forward bias voltage from a transistor to the first PIN diode to conduct the radio frequency power signal through the first matching sub-network; and
  providing a non-forward bias voltage from the transistor to the second PIN diode.

23. The method of claim 22 further comprising isolating the transistor from the second PIN diode by a TRIAC device when the second PIN diode is non-conducting.

24. The method of claim 20 further comprising:
  providing a forward bias voltage from a transistor to the second PIN diode to conduct the radio frequency power signal through the second matching sub-network; and
  providing a non-forward bias voltage from the transistor to the first PIN diode.

25. The method of claim 24 further comprising isolating the transistor from the first PIN diode by a TRIAC device when the first PIN diode is non-conducting.

26. The method of claim 20 further comprising operating in the first mode separately in time from operating in the second mode.

27. The method of claim 20 further comprising coupling the radio frequency power signal through the first matching sub-network and coupling the radio frequency power signal through the second matching sub-network to a single load.

28. The method of claim 20 wherein switching between operating in the first mode and operating in the second mode is fast enough to maintain a plasma.

29. The method of claim 20 further comprising maintaining a charge in a plasma chamber with a keeper circuit during operation in the first mode and operation in the second mode.

30. The method of claim 20 further comprising isolating the radio frequency power signal input from a DC power supply feeding a keeper circuit providing power to the keeper grid.

* * * * *

UNITED STATES PATENT AND TRADEMARK OFFICE
CERTIFICATE OF CORRECTION

| | | |
|---|---|---|
| PATENT NO. | : 6,794,951 B2 | |
| APPLICATION NO. | : 10/212967 | |
| DATED | : September 21, 2004 | |
| INVENTOR(S) | : Kenneth Wilbert Finley | |

It is certified that error appears in the above-identified patent and that said Letters Patent is hereby corrected as shown below:

Title page 1 of the patent, under "Other Publications," line 2, delete "p-1-n" and insert --p-l-n-- therefor.

- In column 1, line 66 of the patent, under "Summary of Invention", delete "V.sub.CBO" and insert --V.sub.CB0-- therefor.

- In column 3, line 50 of the patent, after "RF_IN' delete the single apostrophe (') and insert --",-- therefor.

- In column 4, line 5 of the patent, delete "RR_OUT" and insert --RF_OUT-- therefor.

- In column 6, line 25, of the patent, delete "RR_OUT" and insert --RF_OUT-- therefor.

- In Claim 1, column 7, line 3 of the patent, delete "signal power" and insert --power signal-- therefor.

- In Claim 7, column 7, line 55, of the patent, after "and" insert --the--.

- In Claim 8, column 7, line 58, of the patent, delete "made" and insert --mode-- therefor.

- In Claim 20, column 9, line 2, of the patent, replace both occurrences of "the" with --a--.

UNITED STATES PATENT AND TRADEMARK OFFICE
CERTIFICATE OF CORRECTION

PATENT NO. : 6,794,951 B2
APPLICATION NO. : 10/212967
DATED : September 21, 2004
INVENTOR(S) : Kenneth Wilbert Finley It is certified that error appears in the above-identified patent and that said Letters Patent is hereby corrected as shown below:

- In Claim 20, column 9, line 3, of the patent, after "frequency" insert --power--.

- In Claim 21, column 9, line 18, of the patent, delete the second occurrence of "is".

Signed and Sealed this

First Day of July, 2008

JON W. DUDAS
*Director of the United States Patent and Trademark Office*